United States Patent
Park et al.

(10) Patent No.: US 7,691,496 B2
(45) Date of Patent: Apr. 6, 2010

(54) CUTTING TOOL HAVING HIGH TOUGHNESS AND ABRASION RESISTANCE

(75) Inventors: Geun Woo Park, Cheongju (KR); Chang Kyu Hwang, Cheongju (KR); Yeo Kyun Yoon, Daejeon (KR); Yong Hee Choi, Cheongju (KR); Hyung Keun Joo, Cheongju (KR); Wook Jung Sung, Cheongju (KR)

(73) Assignee: Korloy Inc., Cheongju (KR)

( * ) Notice: Subject to any disclaimer, the term of this patent is extended or adjusted under 35 U.S.C. 154(b) by 0 days.

(21) Appl. No.: 11/113,230

(22) Filed: Apr. 25, 2005

(65) Prior Publication Data

US 2006/0127671 A1    Jun. 15, 2006

(30) Foreign Application Priority Data

Dec. 14, 2004   (KR) ...................... 10-2004-0105735

(51) Int. Cl.
*B32B 9/00* (2006.01)

(52) U.S. Cl. ........................... 428/698; 51/307; 51/309; 428/141; 428/156; 428/176; 428/697; 428/699

(58) Field of Classification Search .................. 51/307, 51/309; 428/141, 156, 174, 697, 698, 699, 428/176

See application file for complete search history.

(56) References Cited

U.S. PATENT DOCUMENTS

| | | | | |
|---|---|---|---|---|
| 5,487,625 A | * | 1/1996 | Ljungberg et al. | ............ 51/307 |
| 5,861,210 A | * | 1/1999 | Lenander et al. | ............ 428/698 |
| 5,863,640 A | * | 1/1999 | Ljungberg et al. | .......... 428/216 |
| 6,015,614 A | * | 1/2000 | Ruppi | ........................ 428/698 |
| 6,177,178 B1 | * | 1/2001 | Ostlund et al. | ................. 51/307 |
| 6,261,673 B1 | * | 7/2001 | Reineck et al. | ............... 57/309 |
| 6,350,510 B1 | * | 2/2002 | Konig et al. | ................ 428/699 |
| 6,723,389 B2 | * | 4/2004 | Kobayashi et al. | ..... 427/249.13 |
| 6,884,496 B2 | * | 4/2005 | Westphal et al. | ............ 428/698 |

* cited by examiner

*Primary Examiner*—Archene Turner
(74) *Attorney, Agent, or Firm*—Birch, Stewart, Kolasch and Birch, LLP

(57) ABSTRACT

Disclosed herein is a cutting tool having high toughness and abrasion resistance, in which a coated cutting tool including a cemented carbide substrate, a cermet substrate or a ceramic substrate coated with a hard coating film by means of chemical vapor deposition, moderate temperature-chemical vapor deposition or physical vapor deposition, and/or a cemented carbide cutting tool, a cermet cutting tool or a ceramic cutting tool are subjected to wet blasting using 10-300 μm sized particles to decrease residual tensile stress or increase residual compressive stress, thereby improving toughness, and also, reducing surface roughness of the cutting tool, thus remarkably increasing chipping resistance and flaking resistance.

8 Claims, 3 Drawing Sheets

CUTTING TOOL HAVING HIGH TOUGHNESS AND ABRASION RESISTANCE

BACKGROUND OF THE INVENTION

1. Field of the Invention

The present invention relates generally to a cemented carbide cutting tool, a cermet cutting tool or a ceramic cutting tool, and/or a coated cutting tool including the above cutting tool as a substrate, which are suitable for use in an indexable insert, and, more particularly, to a method of increasing the toughness and chipping resistance of a cutting tool.

2. Description of the Related Art

In general, to increase the effective lifetime of a cemented carbide cutting tool, the surface of a cemented carbide alloy substrate is coated with a hard ceramic film formed of titanium carbide (TiC), titanium nitride (TiN), titanium carbonitride (TiCN), or alumina ($Al_2O_3$), by means of chemical vapor deposition (CVD), physical-chemical vapor deposition (PCVD) or physical vapor deposition (PVD).

As the coated cutting tool deposited with the $Al_2O_3$ film by means of CVD, a cutting tool composed of a TiC film coated with a 0.5-1.0 μm thick $Al_2O_3$ film was first reported in 1973. Although the cutting tool including the TiC film coated with the $Al_2O_3$ film has slightly lower toughness than a cutting tool including a mono-layered TiC film, it has drastically increased abrasion resistance.

Therefore, to increase the toughness of the coated cutting tool, a TiCN film, coated with an organic CN compound precursor (acetonitrile, $CH_3CN$, etc.) at 800-900° C. by means of moderate temperature-CVD (MT-CVD), is used. That is, the TiCN film, which has been typically deposited using a gas material, such as $TiCl_4$, $CH_4$, $N_2$ or $H_2$, at about 1000-1050° C. by means of high temperature-CVD (HT-CVD), can be deposited by means of MT-CVD at 800-900° C. using gas, such as $TiCl_4$, $CH_3CN$, $N_2$ or $H_2$. Hence, although the TiCN film coated by means of MT-CVD has lower film hardness than the TiC film, it retains film hardness sufficient to increase the abrasion resistance of the cemented carbide alloy coated therewith. Further, since the TiCN film has a columnar crystal structure, the above film per se has high toughness.

EP 408,535 discloses that, as results of phase control studies for an $Al_2O_3$ film having high oxidation resistance, an α-alumina (α-$Al_2O_3$) film and a κ-alumina (κ-$Al_2O_3$) film are suitable for processing cast iron and steel, respectively. Thereby, control techniques for the $Al_2O_3$ film have been rapidly developed and commercialized. In the case of α-$Al_2O_3$, it is advantageous in that because it is only a stable phase among the phases of $Al_2O_3$, it is not phase transformed during cutting. In addition, the above $Al_2O_3$ film having high hardness can exhibit superb cutting performance when cutting cast iron at high speed. In the case of κ-$Al_2O_3$, since it has lower heat conductivity than α-$Al_2O_3$, it manifests high abrasion resistance when cutting steel, which generates lots of heat.

Further, the coating on the coated cutting tool intended to enhance cutting performance may chip away or flake away. The flaking, acting to increase the abrasion of a rake face of the tool, or chipping is caused by low adhesion between the substrate and the film or cut workpiece chips fused on a cutting edge of the cutting tool.

The coated cutting tool manufactured by means of CVD has high abrasion resistance. However, since residual tensile stress attributed to the difference in heat expansion coefficients between the substrate and the film is present on the film, the coated tool has low toughness. Moreover, the coated tool is disadvantageous because chipping, which causes the film to partially chip away when used for cutting, takes place or the film may be wholly detached from the substrate, thus drastically decreasing the lifetime of the tool.

To solve the above problems, WO 9,923,275 discloses a coated cemented carbide body which is subjected to wet blasting at a pressure of 2-6 bar using 30 μm sized $Al_2O_3$ particles. However, the above invention is limitedly applied to a specific layer structure where an $Al_2O_3$ layer is deposited below an outer layer formed of TiN having a thickness of at least 4 μm or a multi-layer film formed of TiN/TiC having a thickness of 4-16 μm. This is because the outer layer formed of TiN weakly adhering to the $Al_2O_3$ layer is easily removed upon wet blasting. In addition, the wet blasting treatment using $Al_2O_3$ particles, which is used to decrease the surface roughness of the tool, hardly affects the change of residual stress, compared to dry blasting.

U.S. Pat. No. 5,635,247 discloses a method of producing an alumina coated cemented carbide body, comprising wet blasting a surface of a κ-$Al_2O_3$ coating film deposited on a cemented carbide substrate using 100 μm sized $Al_2O_3$ particles under 2-6 bar, and then heat treating the surface of κ-$Al_2O_3$ at 900-1100° C. for 0.3-10 hours to cause phase transformation of the κ-$Al_2O_3$ into α-$Al_2O_3$, thus increasing the chipping resistance of the film. However, the above invention is disadvantageous because the coating film subjected to both wet blasting and heat treatment has surface roughness inferior to the coating film subjected to only wet blasting.

In addition, U.S. Pat. Nos. 5,597,272 and 5,776,588 disclose a coated hard alloy tool, in which the top several layers of a multi-layer ceramic coating film of the tool are partially or completely missing along a cutting edge of the tool. As such, at least one oxide layer is included in the missing layers, and the residual stress on the film exposed along the cutting edge is changed to +98~−49 Mpa, and the surface roughness thereof is controlled in the range of 0.05 μm or less. However, the change of the residual stress on the film exposed along the cutting edge is too low to increase the toughness of the tool, and also, limitations are imposed on the uniform removal of only the top several layers of the cutting edge.

US Serial No. 2003/0104254 discloses a method of decreasing residual stress present on a multi-layered coating film using dry blasting to increase toughness, in which the multi-layered coating film formed of TiCN/$Al_2O_3$/ZrCN on a substrate has residual stress of +0.8/+0.4/−1.0 GPa. However, after the blasting using various particles, the residual stress of the coating film is changed as follows, that is, an outer layer formed of ZrCN of the coating film has residual stress of −4.0~−8.0 GPa, the $Al_2O_3$ layer has residual stress of −2.6~−4.3 GPa, and the TiCN layer has residual stress of −0.5~−1.7 GPa. From this, it can be seen that the tensile stress is converted into the compressive stress, resulting in increased compressive stress. However, the coated cutting tool subjected to dry blasting has surface roughness inferior to cutting tools subjected to wet blasting, and also, the residual stress present on the coating film thereof is extremely high, thus the coated cutting tool is easily breakable.

SUMMARY OF THE INVENTION

Accordingly, the present invention has been made keeping in mind the above problems occurring in the prior art, and an object of the present invention is to provide a cutting tool having high toughness while inhibiting chipping and flaking, comprising a coated cutting tool composed of a cemented carbide substrate, a cermet substrate or a ceramic substrate coated with a hard coating film by means of CVD, MT-CVD or PVD, subjected to wet blasting in which the residual stress of several layers of the coating film of the coated cutting tool is changed from tensile stress to compressive stress, or the residual tensile stress is decreased or the residual compressive stress is increased, thus enhancing the toughness of the coated cutting tool, and also, the surface roughness of an outer layer or an outermost layer of the coating film of the coated cutting tool is reduced, thus inhibiting flaking and chipping of the coating film.

Another object of the present invention is to provide a cutting tool having high toughness while inhibiting chipping, comprising a cemented cutting tool, a cermet cutting tool, or a ceramic cutting tool, subjected to wet blasting to change residual stress on the cutting tool from tensile stress to compressive stress or increase residual compressive stress, thus increasing the toughness of the cutting tool, and also, the surface roughness of the cutting tool is reduced, thus inhibiting chipping.

A further object of the present invention is to provide a cutting tool having excellent cutting performance for steel, stainless steel, or cast iron including general cast iron and ductile case iron.

In order to accomplish the above objects, the present invention provides a cutting tool having high toughness and abrasion resistance, comprising a substrate selected from among a cemented carbide substrate, a cermet substrate and a ceramic substrate and a hard coating film deposited on the substrate by means of a vapor deposition process selected from among chemical vapor deposition, moderate temperature-chemical vapor deposition and physical vapor deposition, and subjected to wet blasting using 10-300 µm sized particles to decrease residual tensile stress or increase residual compressive stress and reduce surface roughness.

The cutting tool, which has been subjected to the wet blasting, has surface roughness of 0.05-0.100 µm at an outer layer or an outermost layer of the coating film on a cutting edge thereof. Also, the particles used for the wet blasting have sizes of 10-300 µm, and are directly sprayed onto the cutting tool using compressed air at a pressure of 0.5-5.0 bar. Further, the cutting tool, which has been subjected to the wet blasting, has residual compressive stress of −100~−3900 MPa on the outer layer or the outermost layer of the coating film thereof.

The hard coating film includes an inner layer formed of at least one material selected from among carbides, nitrides, carbonitrides, carbonitroxides, boro-carbides, boro-nitrides, boro-carbonitrides, and boro-carbonitroxides of the IVa to VIa groups in the periodic table, an outer layer formed of at least one material selected from among oxides of Al, Zr and Hf, and an outermost layer formed of at least one material selected from among $Me_wTi_xC_yN_z$ (w+x+y+z=1, w>0, x>0, y>0, z>0) and $Me_xTi_yN_z$ (x+y+z=1, x>0, y>0, z>0) including at least one metal (Me) of the IVa to VIa groups, which are sequentially deposited by means of a vapor deposition process selected from among chemical deposition, moderate temperature-chemical vapor deposition and physical vapor deposition.

In addition, the present invention provides a cutting tool having high toughness and abrasion resistance, comprising a cutting tool selected from among a cemented carbide cutting tool, a cermet cutting tool and a ceramic cutting tool, subjected to wet blasting using 10-300 µm sized particles to decrease residual tensile stress or increase residual compressive stress and reduce surface roughness.

The cutting tool has surface roughness of 0.05-0.100 µm. Also, the particles used for the wet blasting are directly sprayed onto the cutting tool using compressed air at a pressure of 0.5-5.0 bar.

Also, the cutting tool which is subjected to wet blasting has residual compressive stress of −100~−3900 MPa thereon. The cutting tool selected from among a cemented carbide cutting tool, a cermet cutting tool and a ceramic cutting tool is subjected to dry blasting and then wet blasting, using 10-300 µm sized particles.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
FIG. 1 is a scanning electron micrograph showing a 5,000× magnified view of the surface roughness of a coated cutting tool which has been subjected to wet blasting, according to the present invention.
Figure 2:
FIG. 2 is a scanning electron micrograph showing a 5,000× magnified view of the surface roughness of a conventionally coated cutting tool.
Figure 3:
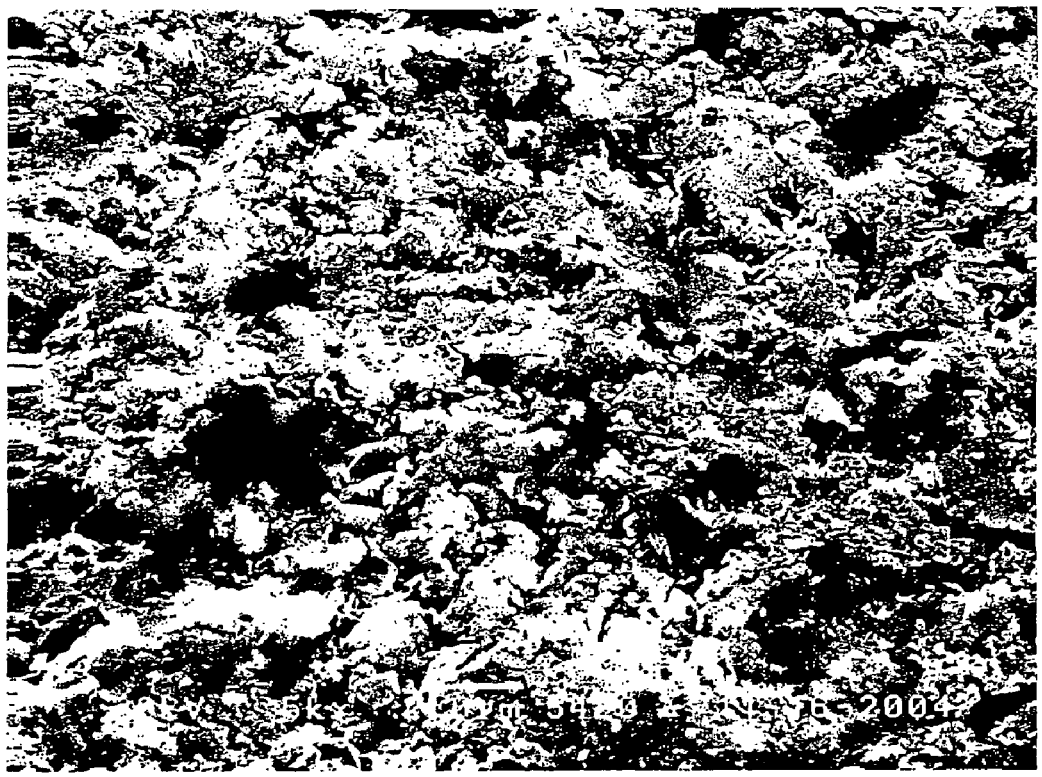
FIG. 3 is a scanning electron micrograph showing a 5,000× magnified view of the surface roughness of a conventionally coated cutting tool which has been subjected to dry blasting.

A better understanding of the present invention may be obtained in light of the following examples which are set forth to illustrate, but are not to be construed to limit the present invention.

EXAMPLE 1

(A) On a cemented carbide substrate for use in a coated cutting tool, corresponding to a grade of ISO K10, a 10.0 µm thick TiCN film, a 5.0 µm thick α-$Al_2O_3$ film, and a 1.0 µm thick TiN film were sequentially deposited by means of MT-CVD, to obtain a coated cutting tool.

The resultant coated cutting tool was subjected to wet blasting using 10-300 µm sized alumina ($Al_2O_3$) particles at a pressure of 0.5-5.0 bar.

(B) On a cemented carbide substrate for use in a coated cutting tool, corresponding to a grade of ISO K10, a 10.0 µm thick TiCN film, a 5.0 µm thick α-$Al_2O_3$ film, and a 1.0 µm thick TiN film were sequentially deposited by means of MT-CVD, to obtain a coated cutting tool.

(C) On a cemented carbide substrate for use in a coated cutting tool, corresponding to a grade of ISO K10, a 10.0 µm thick TiCN film, a 5.0 µm thick α-$Al_2O_3$ film, and a 1.0 µm thick TiN film were sequentially deposited by means of MT-CVD, to obtain a coated cutting tool.

The resultant coated cutting tool was subjected to dry blasting using 10-300 µm sized $Al_2O_3$ particles at a pressure of 0.5-5.0 bar.

Residual stress of the $Al_2O_3$ film, corresponding to an outer layer of the multi-layered coating film, was analyzed by $\sin^2\psi$ method using an X-ray diffraction device.

Surface roughness (Ra) of the coated cutting tool which was subjected to wet blasting was analyzed using 5,000 magnification and an analysis area of 18-24 µm, using an ERA4000 manufactured by Elionix Co. Ltd as a three-dimensional scanning electron microscope.

The coated cutting tool (A) of the present invention and the conventionally coated cutting tools (B) and (C) were measured for surface roughness and residual stress present on the α-$Al_2O_3$ film thereof. The results are shown in Table 1, below.

TABLE 1

| | Sample | Surface Roughness (μm) | Residual Stress on α-Al$_2$O$_3$ (MPa) |
|---|---|---|---|
| Inventive | A | 0.0891 | −146.8 |
| Conventional | B | 0.1146 | +245.7 |
| Conventional | C | 0.1015 | −655.1 |

As is apparent from Table 1, the coated cutting tool (A) of the present invention has surface roughness superior to a conventional cutting tool (B) and a conventional cutting tool which has been subjected to dry blasting (C), and residual stress on the α-Al$_2$O$_3$ film thereof is converted from tensile stress into compressive stress.

EXAMPLE 2

Abrasion resistance of the cutting tools manufactured as in Example 1 was measured. To this end, the same workpiece was processed for 20 min, and an abrasion amount generated on a flank of the tool was measured, and a fraction of the coating film flaked away at a cutting edge thereof was analyzed. The results are shown in Table 2, below.
—Assay Conditions of Abrasion Resistance—
Cutting Conditions: V=400 m/min, f=0.3 mm/rev, d=2.0 mm, wet processing
Workpiece: GC25 (diameter 300 mm, length 600 mm) outer diameter processing
Tool Number: CNMG120408-GR

TABLE 2

| | Sample | Flaking (%) | Abrasion Amount of Flank (mm) |
|---|---|---|---|
| Inventive | A | 0 | 0.125 |
| Conventional | B | 90 | 0.155 |
| Conventional | C | 70 | 0.145 |

As is apparent from Table 2, the coated cutting tool (A) of the present invention has higher chipping resistance and abrasion resistance than the conventional cutting tools (B) and (C).

EXAMPLE 3

The toughness of the coated cutting tools fabricated in Example 1 was measured. To this end, a cylindrical steel having four longitudinal grooves was cut, in which a limited feed rate was measured while a cutting speed and a depth of cut were constant and a feed rate was changed, and breaking resistance was measured while a cutting speed, a depth of cut and a feed rate were constant and the time required to break the tool was measured. The results are shown in Table 3, below.
—Assay Conditions of Limited Feed Rate—
Cutting Conditions: V=150 m/min, f=0.1-0.3 mm/rev, d=2.0 mm, dry processing
Workpiece: SCM440-4 grooves (diameter 300 mm, length 600 mm) outer diameter processing
Tool Number: CNMG120408-GR
—Assay Conditions of Breaking Resistance—
Cutting Conditions: V=210 m/min, f=0.175 mm/rev, d=2.0 mm, dry processing
Workpiece: SCM440-4 grooves (diameter 300 mm, length 600 mm) outer diameter processing
Tool Number: CNMG120408-GR

TABLE 3

| | Sample | Limited Feed Rate (mm/rev) | Breaking Resistance (sec) |
|---|---|---|---|
| Inventive | A | 0.200 | 150 |
| Conventional | B | 0.155 | 1 |
| Conventional | C | 0.200 | 1 |

As is apparent from Table 3, the conventional cutting tool (B) has a limited feed rate of 0.155 mm/rev and breaking resistance of 1 sec. The conventional cutting tool (C) increases in a limited feed rate to 0.200 mm/rev, but has poor breaking resistance of 1 sec. Meanwhile, the inventive cutting tool (A) has a limited feed rate of 0.200 mm/rev and breaking resistance of 150 sec, and hence, is improved in both properties.

EXAMPLE 4

(D) On a cemented carbide substrate for use in a coated cutting tool, corresponding to a grade of ISO P20, a 8.0 μm thick TiCN film, a 2.0 μm thick κ-Al$_2$O$_3$ film, a 0.5 μm thick MT-Zr$_w$Ti$_x$C$_y$N$_z$ (w+x+y+z=1, w>0, x>0, y>0, z>0) film and a 0.5 μm thick Zr$_w$Ti$_x$C$_y$N$_z$ (w+x+y+z=1, w>0, x>0, y>0, z>0) film were sequentially deposited by means of MT-CVD, to obtain a coated cutting tool.
The resultant coated cutting tool was subjected to wet blasting using 10-150 μm sized alumina (Al$_2$O$_3$) particles at a pressure of 0.5-5.0 bar.
(E) On a cemented carbide substrate for use in a coated cutting tool, corresponding to a grade of ISO P20, a 8.0 μm thick TiCN film, a 2.0 μm thick κ-Al$_2$O$_3$ film, a 0.5 μm thick MT-Zr$_w$Ti$_x$C$_y$N$_z$ (w+x+y+z=1, w>0, x>0, y>0, z>0) film and a 0.5 μm thick Zr$_w$Ti$_x$C$_y$N$_z$ (w+x+y+z=1, w>0, x>0, y>0, z>0) film were sequentially deposited by means of MT-CVD, to obtain a coated cutting tool.
The toughness of the coated cutting tool (D) of the present invention and a conventionally coated cutting tool (E) was measured. To this end, a cylindrical steel having four longitudinal grooves was cut, in which a limited feed rate was assayed while a cutting speed and a depth of cut were constant and a feed rate was changed, and breaking resistance was assayed while a cutting speed, a depth of cut and a feed rate were constant and the time required to break the tool was measured. The results are shown in Table 4, below.
—Assay Conditions of Limited Feed Rate—
Cutting Conditions: V=100 m/min, f=0.1-0.5 mm/rev, d=2.0 mm, dry processing
Workpiece: SCM440-4 grooves (diameter 300 mm, length 600 mm) outer diameter processing
Tool Number: CNMG120408-HM
—Assay Conditions of Breaking Resistance—
Cutting Conditions: V=230 m/min, f=0.4 mm/rev, d=2.0 mm, dry processing
Workpiece: SCM440-4 grooves (diameter 300 mm, length 600 mm) outer diameter processing
Tool Number: CNMG120408-HM

TABLE 4

| | Sample | Limited Feed Rate (mm/rev) | Breaking Resistance (sec) |
|---|---|---|---|
| Inventive | D | 0.450 | 115 |
| Conventional | E | 0.215 | 55 |

As is apparent from Table 4, while the conventional cutting tool (E) has a limited feed rate of 0.215 mm/rev and breaking resistance of 55 sec, the inventive cutting tool (D) has a drastically improved limited feed rate of 0.450 mm/rev and breaking resistance of 115 sec.

EXAMPLE 5

(F) A cermet cutting tool, corresponding to a grade of ISO P20, was subjected to wet blasting using 10-300 μm sized alumina ($Al_2O_3$) particles at a pressure of 0.5-5.0 bar.

(G) A cermet cutting tool, corresponding to a grade of ISO P20, was subjected to dry blasting and then wet blasting, using 10-300 μm sized alumina ($Al_2O_3$) particles at a pressure of 0.5-5.0 bar.

(H) A cermet cutting tool, corresponding to a grade of ISO P20, was used.

Residual stress and toughness of the cermet cutting tools (F) and (G) of the present invention and of a conventional cutting tool (H) were measured. The residual stress of the cermet cutting tool was assayed by a sin 2 method using an X-ray diffraction device. Toughness was measured by cutting a cylindrical steel having four longitudinal grooves, in which a limited feed rate was assayed while a cutting speed and a depth of cut were constant and a feed rate was changed, and breaking resistance was assayed while a cutting speed, a depth of cut and a feed rate were constant and the time required to break the tool was measured. The results are shown in Table 5, below.

—Assay Conditions of Limited Feed Rate—

Cutting Conditions: V=100 m/min, f=0.1-0.4 mm/rev, d=2.0 mm, dry processing

Workpiece: SCM440-4 grooves (diameter 300 mm, length 600 mm) outer diameter processing Tool Number: CNMG120408-HM

TABLE 5

| | Sample | Surface Roughness (μm) | Residual Stress (GPa) | Limited Feed Rate (mm/rev) |
|---|---|---|---|---|
| Inventive | F | 0.0914 | −1.6 | 0.225 |
| Inventive | G | 0.0922 | −2.2 | 0.250 |
| Conventional | H | 0.1105 | −1.3 | 0.155 |

As is apparent from Table 5, the cutting tools (F) and (G) of the present invention have surface roughness superior to the conventional cutting tool (H). The conventional cermet cutting tool (H) has residual stress of −1.3 GPa, while the cermet cutting tools (F) and (G) of the present invention have residual stress of −1.6 and −2.2 GPa, respectively. From this, it can be shown that residual compressive stress is further increased in the case of the present invention. As for the toughness, the conventional cermet cutting tool (H) has a limited feed rate of 0.155 mm/rev, while the cermet cutting tools (F) and (G) of the present invention have limited feed rates increased to 0.225 and 0.250 mm/rev, respectively.

As described above, the present invention provides a cutting tool having high toughness and abrasion resistance, in which a coated cutting tool composed of a cemented carbide substrate, a cermet substrate or a ceramic substrate coated with a hard coating film by means of CVD, MT-CVD or PVD, and/or a cemented carbide cutting tool, a cermet cutting tool or a ceramic cutting tool are subjected to wet blasting using 10-300 μm sized particles to decrease residual tensile stress or increase residual compressive stress, thereby improving toughness. Further, the surface roughness of the above cutting tool is reduced, therefore remarkably increasing chipping resistance and flaking resistance.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A cutting tool having high toughness and abrasion resistance, comprising:
    a substrate selected from among a cemented carbide substrate, a cermet substrate and a ceramic substrate; and
    a hard coating film deposited on the substrate by means of a vapor deposition process selected from among chemical vapor deposition, moderate temperature-chemical vapor deposition and physical vapor deposition, and subjected to wet blasting using 10-300 μm sized particles to decrease a residual tensile stress or increase a residual compressive stress and reduce a surface roughness,
    wherein the residual compression stress of the coated cutting tool, which has been subjected to the wet blasting, is −100~−3900 MPa on an outer layer or an outermost layer of the coating film thereof, and
    wherein the surface roughness of the coated cutting tool, which has been subjected to the wet blasting, is 0.05-0.100 μm at the outer layer or the outermost layer of the coating film on a cutting edge thereof.

2. The cutting tool as set forth in claim 1, wherein the particles used for the wet blasting are directly sprayed onto the cutting tool using compressed air at a pressure of 0.5-5.0 bar.

3. The cutting tool as set forth in claim 1, wherein the hard coating film includes:
    an inner layer formed of at least one material selected from among carbides, nitrides, carbonitrides, carbonitroxides, boro-carbides, boro-nitrides, boro-carbonitrides, and boro-carbonitroxides of the IVa to VIa groups in the periodic table,
    an outer layer formed of at least one material selected from among oxides of Al, Zr and Hf, and
    an outermost layer formed of at least one material selected from among $Me_wTi_xC_yN_z$ (w+x+y+z=1, w>0, x>0, y>0, z>0) and $Me_xTi_yN_z$ (x+y+z=1, x>0, y>0, z>0) including at least one metal (Me) of the IVa to VIa groups, which are sequentially deposited by means of the vapor deposition process selected from among chemical deposition, moderate temperature-chemical vapor deposition and physical vapor deposition.

4. The cutting tool as set forth in claim 1, wherein a thickness of the hard coating film is about 1.0 μm.

5. A cutting tool having high toughness and abrasion resistance, comprising:
    said cutting tool being selected from among a cemented carbide cutting tool, a cermet cutting tool and a ceramic cutting tool, subjected to wet blasting using 10-300 μm sized particles to decrease a residual tensile stress or increase a residual compressive stress and reduce a surface roughness, and
    wherein the residual compression stress of the cutting tool, which has been subjected to the wet blasting, is −100~−3900 MPa on an outer layer or an outermost layer of a coating film thereof, and
    wherein the surface roughness of the cutting tool is 0.05-0.100 μm.

6. The cutting tool as set forth in claim 5, wherein the particles used for the wet blasting are directly sprayed onto the cutting tool using compressed air at a pressure of 0.5-5.0 bar.

7. The cutting tool as set forth in claim 5, wherein the cutting tool selected from among the cemented carbide cutting tool, the cermet cutting tool and the ceramic cutting tool is first subjected to dry blasting and then web blasting, using the 10-300 µm sized particles.

8. The cutting tool as set forth in claim 5, wherein a thickness of the coating film is about 1.0 µm.

* * * * *